United States Patent
Dawirs et al.

(10) Patent No.: US 10,223,195 B2
(45) Date of Patent: Mar. 5, 2019

(54) COUNTER IN A FLASH MEMORY

(71) Applicant: Proton World International N.V., Diegem (BE)

(72) Inventors: Michel Dawirs, Wezembeek-Oppem (BE); Guillaume Docquier, Liege (BE)

(73) Assignee: Proton World International N.V., Diegem (BE)

( * ) Notice: Subject to any disclaimer, the term of this patent is extended or adjusted under 35 U.S.C. 154(b) by 0 days.

(21) Appl. No.: 15/378,569

(22) Filed: Dec. 14, 2016

(65) Prior Publication Data
US 2017/0337104 A1    Nov. 23, 2017

(30) Foreign Application Priority Data
May 20, 2016    (FR) ..................................... 16 54499

(51) Int. Cl.
*G06F 11/00*    (2006.01)
*G06F 11/10*    (2006.01)
*G11C 29/52*    (2006.01)
*G06F 12/02*    (2006.01)

(52) U.S. Cl.
CPC ...... *G06F 11/1044* (2013.01); *G06F 11/1068* (2013.01); *G06F 12/0246* (2013.01); *G11C 29/52* (2013.01); *G06F 2212/1032* (2013.01); *G06F 2212/7207* (2013.01); *G06F 2212/7209* (2013.01)

(58) Field of Classification Search
None
See application file for complete search history.

(56) References Cited

U.S. PATENT DOCUMENTS

| | | | | |
|---|---|---|---|---|
| 6,000,006 | A * | 12/1999 | Bruce | G06F 11/1068 711/103 |
| 6,226,295 | B1 * | 5/2001 | Morzano | G11C 7/1018 370/395.31 |
| 2005/0081101 | A1 | 4/2005 | Love et al. | |
| 2009/0119450 | A1 | 5/2009 | Saeki et al. | |
| 2013/0219110 | A1 | 9/2013 | Landenbach et al. | |
| 2013/0318419 | A1 * | 11/2013 | Seol | G06F 11/1412 714/773 |
| 2014/0310483 | A1 * | 10/2014 | Bennett | G06F 12/00 711/154 |
| 2015/0317245 | A1 | 11/2015 | Van Keer et al. | |
| 2016/0300609 | A1 * | 10/2016 | Han | G11C 16/26 |

* cited by examiner

*Primary Examiner* — Daniel F. McMahon
(74) *Attorney, Agent, or Firm* — Seed IP Law Group LLP

(57) ABSTRACT

A counter is stored in a page of a flash memory having a plurality of pages. Header information is written to the page. The header information includes a first word containing a number of the page, a second word containing a first value of the counter, and a third word containing an initial error control code, which takes into account the first value of the counter. Counter information is written into frames of the selected page. The frames have a same number of words. Writing counter information into a frame includes writing a counter identifier that identifies the counter and a value independent from the counter identifier into the frame. A current value of the counter is determined based on the first value of the counter in the header data and frames of the selected page into which the counter information is written.

23 Claims, 5 Drawing Sheets

COUNTER IN A FLASH MEMORY

BACKGROUND

Technical Field

The present disclosure generally relates to electronic circuits and, more specifically, to circuits using a flash memory. The present disclosure more specifically aims at the management of flash memory counters.

Description of the Related Art

Flash memories are increasingly used in microcontrollers to store data in nonvolatile fashion.

Data storage in a flash memory has various time constraints due to the granularity of the performed operations, the writing being performed word by word (for example, by word of four bytes), while the erasing is performed page by page of several words (from a few tens to a few hundreds of words).

To manage a flash memory counter, the transactions (increment/decrement) performed and stored should respect an atomicity criterion. The atomicity of a transaction corresponds to ascertaining that data stored in a memory effectively have a processable and whole state. This amounts to ascertaining that data in the non-volatile memory have either their state before the transaction or their state after the concerned transaction, but that they do not have an intermediate state.

Transaction atomicity management is particularly used in applications where an interruption of the circuit power supply or the occurrence of an incidental or intentional disturbance may generate the storage of data in a state which makes them either impossible to subsequently process or vulnerable in terms of confidentiality. For example, in the field of microcircuit cards, it is desired to ascertain that in case of a deliberate or incidental untimely tearing of a card from the reader where it has been placed, the data contained in a flash memory of the card are reliable. In a circuit integrating a security module, the equivalent of an untimely tearing corresponds to a powering off of the circuit.

BRIEF SUMMARY

One or more embodiments of the present disclosure improve management of counters stored in a flash memory, in particular preserve the atomic character of the increments/decrements of the counter value.

One or more embodiments of the present disclosure improve management of a plurality of counters in a same flash memory.

An embodiment improves the endurance (the number of possible write operations) of the storage of a counter in a flash memory.

An embodiment eases the management of the atomicity of the updates of a counter in a flash memory.

Thus, an embodiment provides a method of storing at least one counter into a flash memory, wherein each page of the memory assigned to the storage of the counter(s) comprises:

header data including a first word intended to contain a number of the page, one word per counter to store a first value thereof, and a second word intended to contain an error control code calculated by taking into account first values;

frames all having a same number of words, each frame being intended to contain a value independent from the frame data, and at least one occurrence of an identifier of a counter, each written frame representing an increment or decrement of the value of the concerned counter with respect to its first value.

According to an embodiment, a new frame is written for each update of the value of a counter.

According to an embodiment, the frames are written sequentially in a page.

According to an embodiment, each frame is further intended to contain an error control code word calculated by taking into account the other words in the frame.

According to an embodiment, said value independent from the frame data is the same for all the frames in the page.

According to an embodiment, said header data are written before the writing of a first frame in the page.

According to an embodiment, the current value of a counter is calculated by updating the first value of this counter according to all the frames in the page which comprise the identifier of this counter.

According to an embodiment, each frame further comprises a word for storing the increment or decrement value of the concerned counter.

According to an embodiment, the increment or decrement value is the unit.

According to an embodiment, the initialization of a new page goes along with a writing of the header data with, as a first value, the current values of the counters calculated based on the previous page.

An embodiment provides a flash memory programmed according to the above method.

An embodiment provides an electronic circuit comprising a flash memory.

The foregoing and other features and advantages will be discussed in detail in the following non-limiting description of specific embodiments in connection with the accompanying drawings.

DETAILED DESCRIPTION

Figure 1:
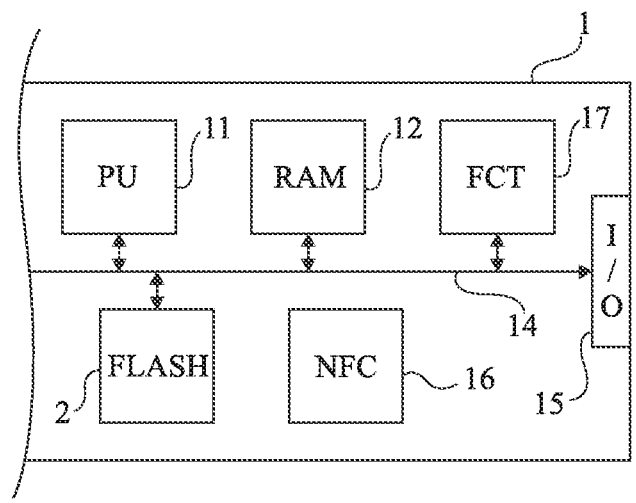
FIG. 1 very schematically shows, in the form of blocks, an embodiment of an electronic circuit of the type to which the embodiments which will be described apply as an example.

The same elements have been designated with the same reference numerals in the different drawings.

For clarity, only those steps and elements which are useful to the understanding of the embodiments which will be described have been shown and will be detailed. In particular, the electric behavior of a flash memory during write, read, and erase steps have not been detailed, the described embodiments being compatible with usual flash memory technologies. Further, the applications using counters and an atomicity management have not been detailed either, the described embodiments being here again compatible with usual applications.

FIG. 1 very schematically shows, in the form of blocks, an embodiment of an electronic circuit 1 of the type to which the embodiments which will be described apply as an example.

Circuit 1 comprises:

a processing unit 11 (PU), for example, a state machine, a microprocessor, a programmable logic circuit, etc.;

one or more volatile storage areas 12 (RAM), for example of RAM or register type, to temporarily store information (instructions, addresses, data) during the processings;

one or more non-volatile storage areas 2, including at least one flash-type memory 2 (FLASH) for durably storing information, in particular when the circuit is not powered;

one or more data, address, and/or control buses 14 between the different elements internal to circuit 1; and an input/output interface 15 (I/O) of communication, for example, of series bus type, with the outside of circuit 1.

Circuit 1 may also integrate a contactless communication circuit 16 (CLF—ContactLess Front-end), of near-field communication type (NFC).

Further, circuit 1 may integrate other functions, symbolized by a block 17 (FCT), according to the application, for example, a crypto-processor, other interfaces, other memories, etc.

The management of one or more counters stored in a flash memory and the management of the atomicity of the increments/decrements of these counters in a circuit equipped with a flash memory is particular, since the flash memory does not have the same processing granularity according to the type of operation. In particular, the writing is performed word by word (of one byte or of a few bytes) while the erasing is performed page by page. The size of a word generally corresponds to the size of a register receiving the data in series to transfer them in parallel to the memory plane for a write operation. A page is defined as being the minimum size capable of being simultaneously addressed to be erased. Typically, a page currently comprises, in a flash memory, 64, 128, 256, 512, or 1,024 bytes.

A flash memory is programmed from an initial state, arbitrarily designated as 1, to states 0 (non-conductive states of the cells). This means that the memory cells should be initialized to a high state (erasing) and that, to store a piece of data (in write mode), action is taken (programming to 0) or not (bit state at 1) on the bit states per data word.

To guarantee the atomicity of transactions, the storage in the flash memory of a piece of data should only be considered as valid once the transaction is over and the data are said to be stable. In practice, atomicity management methods activate an indicator of the processing of data when said data are extracted from the non-volatile memory, and then organize the storage of the updated data, once the processing is over, the processing indicator then switching state. The atomicity may concern a larger or smaller quantity of data according to the nature of the transaction.

The atomicity of transactions is particularly important in the case of counters for which it is important to ascertain that the information stored in the flash memory, for example, the balance of an electronic purse or of a purchase authorization, or the number of attempts to enter a code, is reliably stored.

Generally, to guarantee the atomicity of a transaction, atomicity buffers which are updated with the initial and then with the final information are used for a transfer into the main non-volatile memory.

However, in the case of a flash memory, a difficulty is the erasing procedure, due to its page granularity, which is relatively long as compared with the word writing operation.

In contactless applications, transactions have to be carried out very rapidly due to the fleetingness of the communication, which depends on the time during which circuit 1 can communicate with a terminal. Now, managing the atomicity of transactions by using flash memory buffers takes time, due to the erase operations which are necessary to authorize a programming.

According to the embodiments which will be described, the storage of counters in pages of a flash memory is provided to be organized in specific fashion.

Figure 2:
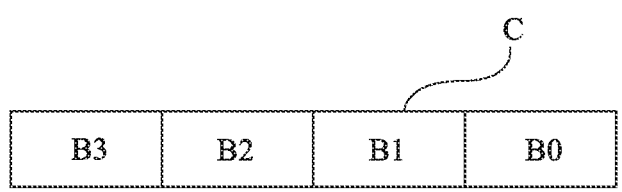
FIG. 2 illustrates an embodiment of a counter recording structure.

FIG. 2 illustrates an embodiment of a counter recording structure.

According to this embodiment, a counter C, or rather a value of this counter, is stored in four bytes B0, B1, B2, and B3. Four bytes is a size quite sufficient to represent the value of any counter. However, other sizes, for example, one byte, two bytes, etc. may be provided. Here, advantage is taken with four bytes that this corresponds to the size of a word of the flash memory.

Figure 3:
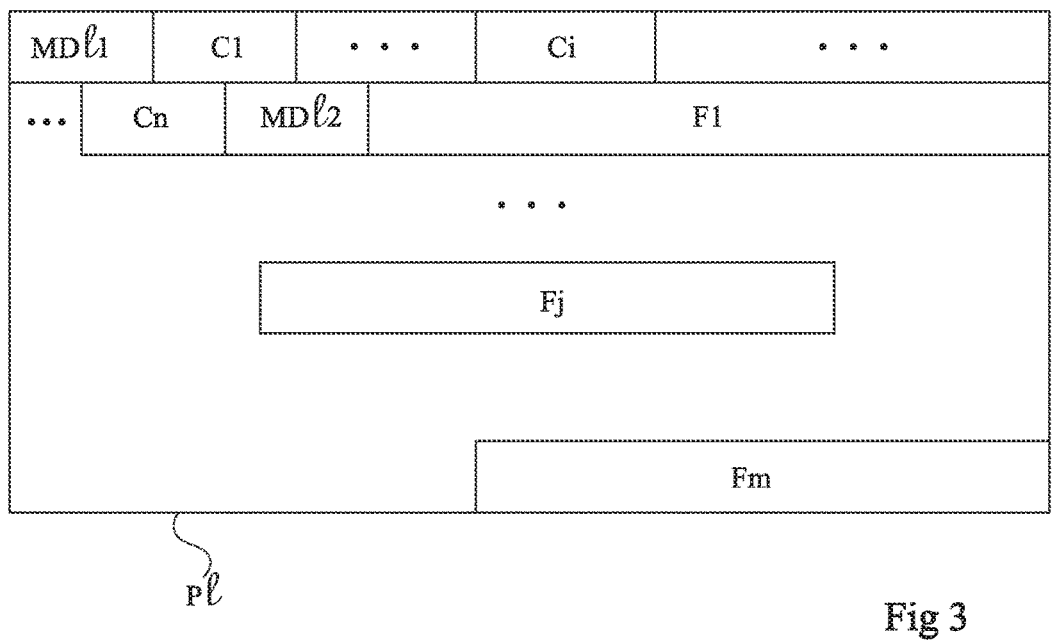
FIG. 3 illustrates an embodiment of a data organization in a flash memory page.

FIG. 3 illustrates an embodiment of a data organization in a flash memory page.

To respect the erasing constraint, the memory is physically organized in pages Pl, representing the erasing granularity, and comprises at least two pages. Each page comprises a same number of words, forming the write (and read) granularity. All the pages into which the counter(s) are stored have the same structure. A memory management circuit is in charge of organize its addressing, the writing, the reading, and the erasing. This circuit or management unit may be the processing unit. The unit for managing memory 2 converts virtual addresses provided by the different entities into physical addresses.

Each page Pl starts with header data. Physically, although the header data may be anywhere in the page, from the logic point of view, the page is considered as preferably starting with header data. The header data comprise:

a first metadata word MDl1 containing the page number, incremented on each use of a new page when the previous page is full;

n words $C_i$, each containing the initial value of one or a plurality of counters for the concerned page (according to the size of the counters, a few counters may share a same word $C_i$—the example of one counter per word will be taken hereafter); and a second metadata word MDl2 containing a CRC-type error control code, signature, or other, calculated from the initial values of counters $C_i$ and, preferably, from the page number.

The rest of page Pl is intended to contain recordings representing increments of the counter (although reference will be made hereafter to increments, decrements may also be used). According to this embodiment, the rest of the page is divided into m frames $F_j$, each comprising a same number of data words (for example, four words). One can thus store, in each page, up to m frames $F_j$ representing recordings of successive updates (increment words) of one or of a plurality of counters.

It should be reminded that, when a word is blank (erased), all its bits are in a first state (designated as high or 1). The programming of a word to store a value therein comprises selecting the bits of the bytes of the word which should switch state and be written (switch to the low state or 0). The programming of a flag or indicator comprises programming the bit(s) of the byte in the state corresponding to the low state. It should be reminded that once it has been written or programmed to state 0, the content of the word cannot be modified, unless the entire page is erased and reprogrammed. Thus, once a word has been written into a page, it can no longer be touched, unless the entire page is erased. The writing into pages Pl is performed sequentially into each page.

The writing of the data into the memory is performed frame by frame and word by word as they are being received and successively into the page. Thus, in case of successive writings of an increment of a same counter, this increment may end up being written a plurality of times into the page (in different frames) along the write operations. This takes part in the resolution of the atomicity problem since, from the moment that the page contains initial value Ci of a counter, one may always, during subsequent read operations, return to the last increment recorded in stable fashion.

Figure 4:
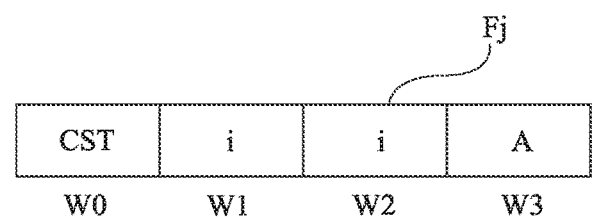
FIG. 4 illustrates an embodiment of a structure of a counter update recording frame.

FIG. 4 illustrates an embodiment of a structure of a counter update recording frame Fj.

According to this embodiment, a word W0 of fixed value CST is first written, followed by a word W1 containing an identifier i of the counter concerned by frame Fj, and finally by a word W3, for example, non-programmed or containing a value A, for example, an error control code CRC of the frame. Preferably, identifier i of the counter is stored twice (in words W1 and W2). Fixed value CST is for example the same for all frames Fj of page Pl. As a variation, it is an identical constant for all the memory pages or, conversely, a deterministic value different for each frame, based on the position (the identifier) of the frame. Value CST should however not depend on the counter incremented in the frame. Due to the use of a fixed value for word W0 of each frame Fj, it will be possible to ascertain that there has been no untimely tearing or attack at the beginning of the writing of the frame, for example, an attempt to modify the content of a word during an attack. Value A is a cancellation indicator. It is generally not programmed. It is used to indicate that a frame should be ignored when an untimely tearing has been detected.

Figure 5:
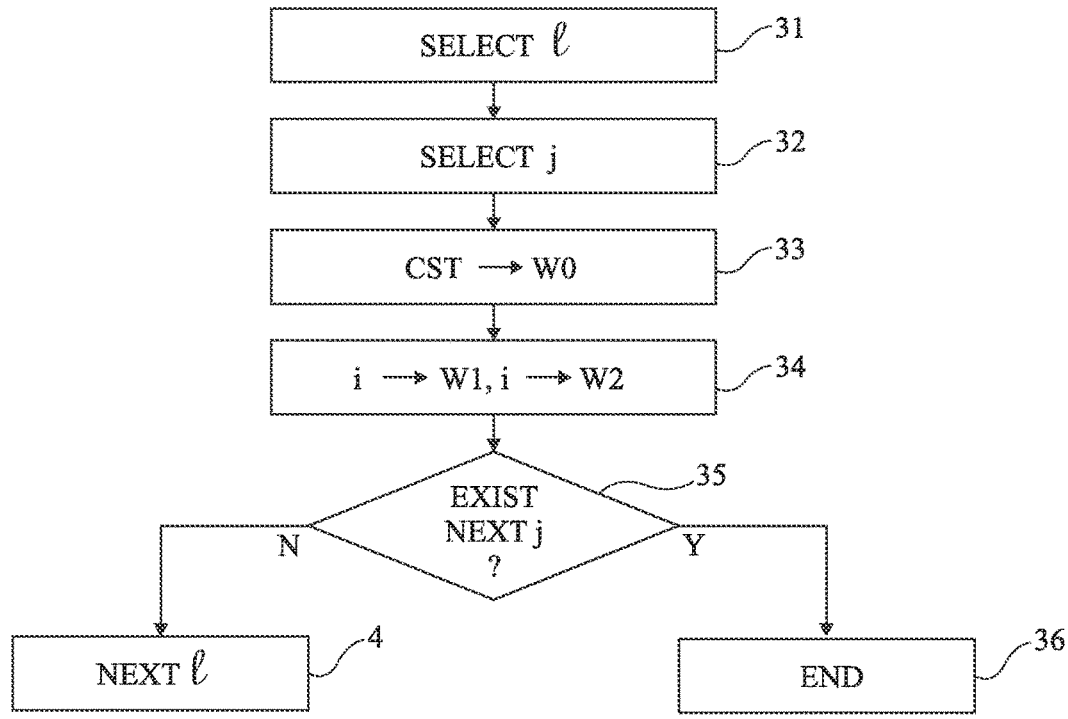
FIG. 5 is a block diagram illustrating an embodiment of an increment of a counter in the memory.

FIG. 5 is a block diagram illustrating an embodiment of an increment of a counter in the memory.

It is assumed that the current page Pl has been previously initialized with the header data.

One first selects (block 31, SELECT l) the page Pl having the highest page number l by scanning (reading) metadata words MDl1 (or MDl2) of the pages.

Then (block 32, SELECT j), the first frame Fj sequentially available in page Pl is identified. The selection is for example performed by successively scanning the frames until reaching the first one having an unprogrammed word W0 intended for fixed value CST. As a variation, the first frame having an unprogrammed counter identifier i is selected. It is assumed in this example that a new page is opened at the end of the writing of the last frame of a page. Accordingly, an available frame is necessarily found at step 32.

As a variation, if no frame is free, this means that the page is full. A new page opening subroutine is then executed. This subroutine will be discussed hereafter in relation with FIG. 6.

Once frame Fj has been selected, it is started by reading (block 33, CST→W0), in frame Fj, the first word W0 of fixed value CST. The identifier of the counter to be incremented is then written (block 34, i→W1, i-W2) into words W1 and W2. Word W3 is left unprogrammed.

It is then checked whether the page is full, that is, whether there exists a frame Fj available for the next write operation (block 35, EXIST NEXT j?). If it is (output Y of block 35), the writing ends (block 36, END).

If it is not (output N of block 35), that is, if there is no further available frame, the next page is prepared for the next write operation (block 4, NEXT l).

Figure 6:
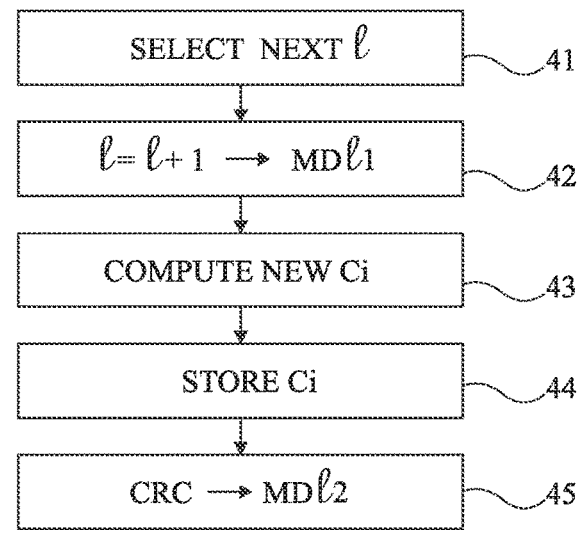
FIG. 6 is a block diagram illustrating an embodiment of a preparation of a next page for a write operation when a current page is full.

FIG. 6 is a block diagram illustrating an embodiment of a preparation of a next page for a write operation when a current page is full.

It is started (block 41, SELECT NEXT l) by selecting the next page Pl available, that is, blank or erased. The value of the number of written pages, incremented by 1, (block 42, l=l+1→MDl1) is stored into the first metadata word MDl1. The final values of the counters of the previous page are then calculated to become the initial values for the new page (block 43, COMPUTE NEW Ci) and these values are stored (block 44, STORE Ci) into the new page. Finally, the CRC of the initial values of the counters now recorded is calculated and stored (block 45, CRC→MDl2).

Once these operations have been carried out, the previous page is obsolete and can thus be erased. Thus, the minimum number of memory pages to implement the described embodiments is two. However, a larger number of memory pages may be provided to increase the counter lifetime, the number of erase operations in a same page being limited by the memory endurance.

The calculation of the final values of the counters is performed in the same way as the reading of a counter by performing the corresponding calculation for each counter and over the entire page.

Figure 7:
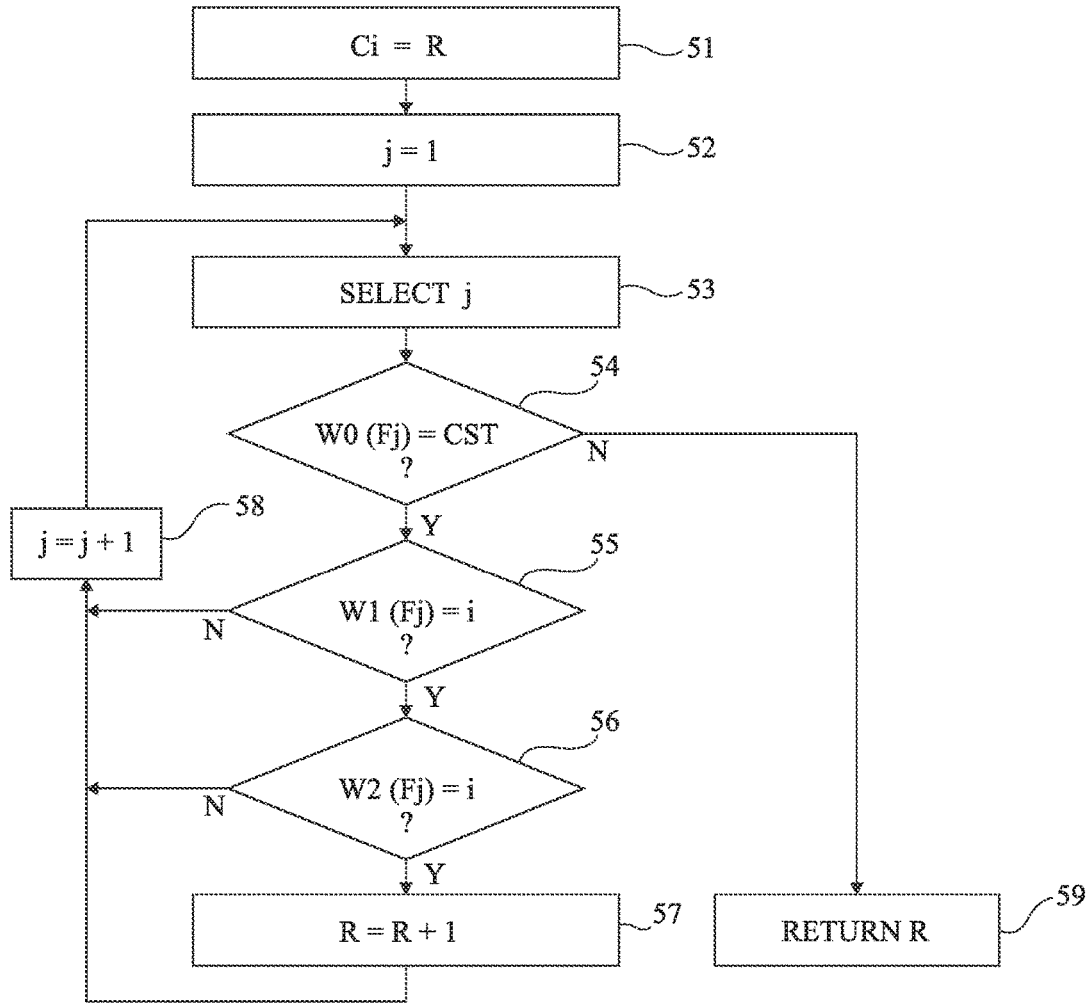
FIG. 7 illustrates, in the form of block diagrams, an embodiment of a reading of the value of a counter in the flash memory.

FIG. 7 illustrates in the form of block diagrams an embodiment of a reading of data A from memory 2.

It is started (block 51, Ci→R) by reading the initial value of the counter in the page, which is stored into a register or a volatile memory element. The successive frames Fj of the page are then scanned by looking for those concerning counter Ci.

For example, an index j is initialized at 1 (block 52, j=1). Then, the frame of rank j is selected (block 53, Select j) and it is verified that it is programmed. For example, it is verified that its first word contains constant CST (block 54, W0(Fj)=CST?). If it does (output Y of block 54), its word W1 (or W2) is read to verify that it contains identifier i (block 55, W1(Fj)=i?). If it does (output Y of block 55), the same test is performed (block 56, W2(Fj)=i?) on the other identifier word W2 (or W1). Such an optional double check provides additional security. If the two tests 55 and 56 are positive (output Y of block 56), the value of register R is incremented (block 57, R=R+1). The frame index is then incremented (block 58, j=j+1) and the next frame is selected (block 53). If one of tests 55 or 56 comes out negative (output N of block 55 or 56), it is also proceeded to the next frame (blocks 58 and 53).

When all the written frames have been scanned (output N of block 54), the value of register R is returned (block 59, RETURN R) as being the final value of counter Ci.

In a page change, test 54 can be spared since all the frames are written into.

With such a write and read process in memory 2, one can, in read mode, find the last atomic transaction for each counter. Indeed, if a transaction has not properly ended, identifier i is not programmed in word W2 and the value of the register is not incremented. If word W3 is used as a write indicator, this word just has to be read for each frame. Word W3 may for that matter comprise a CRC-type code calculated on the values of the first three words to perform an additional verification during the reading and detect a possible disturbance of the frame.

Figure 8:
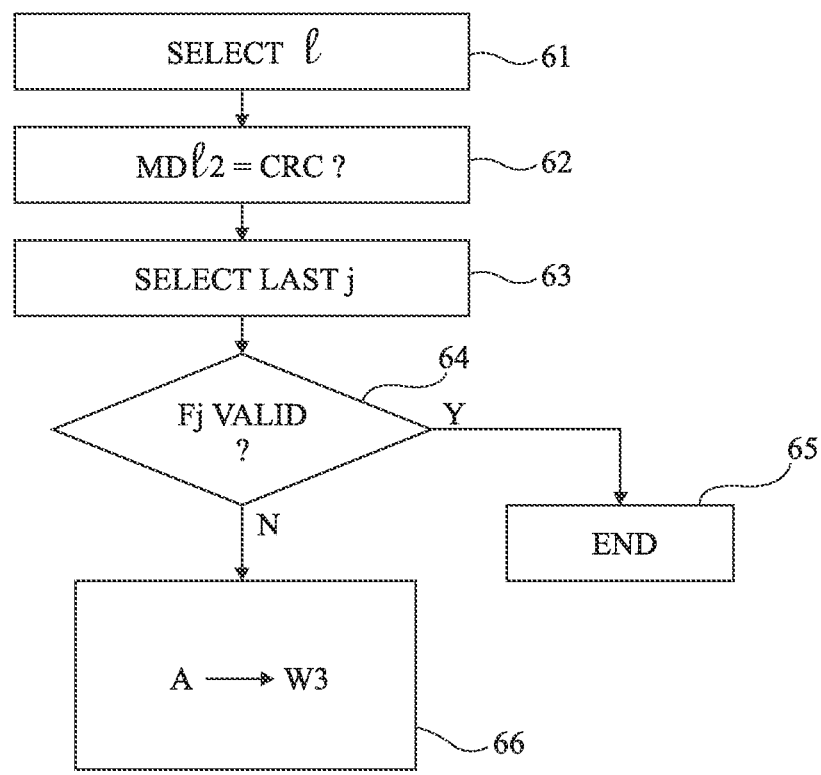
FIG. 8 is a block diagram illustrating an embodiment of an atomicity recovery.

FIG. 8 is a block diagram illustrating an embodiment of an atomicity recovery.

In practice, this process is carried out at the starting or on resetting of the circuit, which amounts to verifying the atomicity after each incidental or deliberate untimely tearing or powering off.

The page having the maximum order number l is first selected (block 61, SELECT l).

Then, its initial values Ci are loaded and the code CRC contained in the header metadata is verified (block 62, MDl2=CRC?) to make sure that the tearing has not occurred during the page initialization and that the initial values of the counters are valid.

Then, the last frame written into this page is selected (block 63, SELECT LAST j) and it is verified that it effectively contains valid data (block 64, Fj VALID?). For example, it is verified that the first word W0 effectively contains constant CST and that the two words W1 and W2 are effectively programmed with an existing counter identifier i. As a variation, if the last word W3 contains a CRC, the CRC is verified.

If everything is correct (output Y of block 64), there is no atomicity issue and the powering off or resetting has occurred after the write processes into the flash memory had ended. The normal operation is then resumed (block 65, END). In the opposite case (block 66, A→W3), value A is programmed in word W3 to indicate that the current frame contains an invalid value and should be ignored. As a variation, the counter values are transferred into a new page. To achieve this, a process similar to that of initialization of a new page is implemented when the current page is full (FIG. 6).

With such a write process in memory 2, one can, in read mode, find the last atomic transaction for each counter.

According to an alternative embodiment, one of the words of frames Fj (either an additional word, or word W2 or W3) contains the increment/decrement value to be applied to the counter. Thus, the increment is not necessarily of one unit. Further, a same counter may be updated in both directions (increment/decrement) in a same page and this, with different values for each increment/decrement.

The increment/decrement may be implicit, each written frame represents an increment or a decrement without it being necessary to indicate in the frame the value of this increment/decrement. This may in particular concern the case of a unit increment or decrement.

The number of stored counters (at least one) depends on the application and does not affect the operation.

An advantage of the embodiments which have been described is that they improve the management of counters in a flash memory while preserving an atomicity criterion.

Another advantage is that they easily enable to trace back the last atomic value of a counter.

Various embodiments have been described. Various alterations, modifications, and improvements will readily occur to those skilled in the art. Further, the practical implementation of the described embodiments is within the abilities of those skilled in the art based on the functional indications given hereabove and by using circuits usual per se. Particularly, the organization of the memory addressing and the generation of the signals adapted to the control of said memory and to this addressing use techniques usual per se.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A method, comprising:
    calculating an initial error control code taking into account a first value of a counter of a plurality of counters;
    storing the counter into a selected page of a flash memory having a plurality of pages, the selected page being configured to store the plurality of counters, wherein the storing the counter includes:
        writing header data into the selected page, the header data including a first word containing a number of the selected page, a second word containing the first value of the counter, and a third word containing the initial error control code; and
        writing counter information into frames of the selected page, the frames having a same number of words, wherein writing the counter information into a frame includes writing into the frame a counter identifier that identifies the counter of the plurality of counters and a value independent from the counter identifier; and
    determining a current value of the counter based on the first value of the counter in the header data and frames of the selected page into which the counter information is written.

2. The method of claim 1, wherein writing the counter information includes updating the current value of the counter by writing the counter information into a new frame of the selected page.

3. The method of claim 1, wherein the counter information is written sequentially into the frames of the selected page.

4. The method of claim 1, wherein writing the counter information includes, for each frame into which the counter information is written, calculating a frame error control code word by taking into account the counter identifier written into the frame.

5. The method of claim 1, wherein said value independent from the counter identifier is the same for all the frames in the selected page into which the counter identifier is written.

6. The method of claim 1, wherein said header data are written before a first frame is written into the selected page.

7. The method of claim 1, wherein determining the current value of the counter comprises incrementing or decrementing the first value of the counter in the header data a number of times equal to how many frames in the selected page include the counter identifier of the counter.

8. The method of claim 1, wherein writing the counter information into the frame includes writing an increment value or a decrement value of the counter into the frame.

9. The method of claim 8, wherein determining the current value of the counter comprises incrementing or decrementing the first value of the counter written in the header data by the increment or decrement value a number of times equal to how many frames in the selected page include the counter identifier of the counter.

10. The method of claim 1, wherein writing header data into the selected page includes calculating the first value of the counter based on a previous counter value in a previous page.

11. A flash memory control circuit that, in operation, performs a method comprising:
   calculating an initial error control code taking into account a first value of a counter of a plurality of counters; and
   storing the counter into a selected page of a flash memory having a plurality of pages, the selected page being configured to store the plurality of counters, wherein the storing the counter includes:
      writing header data into the selected page, the header data including a first word containing a number of the selected page, a second word containing the first value of the counter, and a third word containing the initial error control code; and
      writing counter information into frames of the selected page, the frames having a same number of words, wherein writing the counter information into a frame includes writing into the frame a counter identifier that identifies the counter of the plurality of counters and a value independent from the counter identifier; and
   determining a current value of the counter based on the first value of the counter in the header data and frames of the selected page into which the counter information is written.

12. The flash memory control circuit of claim 11, wherein writing the counter information includes updating the current value of the counter by writing the counter information into a new frame of the selected page.

13. The flash memory control circuit of claim 11, wherein the method includes determining the current value of the counter by incrementing or decrementing the first value of the counter a number of times equal to how many frames in the selected page include the counter identifier of the counter.

14. The flash memory control circuit of claim 11, wherein writing the counter information into the frame includes writing an increment value or a decrement value into the frame, and the determining the current value of the counter comprises incrementing or decrementing the first value of the counter based on the increment values or the decrement values written into frames into which the counter information is written.

15. The flash memory control circuit of claim 11, wherein writing header data into the selected page includes calculating the first value of the counter based on a previous counter value in a previous page.

16. An electronic circuit comprising:
   a flash memory having a plurality of pages; and
   a flash memory control circuit that, in operation, performs a method that includes:
      calculating an initial error control code taking into account a first value of a counter of a plurality of counters; and
      storing the counter into a selected page of the flash memory, the selected page being configured to store the plurality of counters, wherein the storing the counter includes:
         writing header data into the selected page, the header data including a first word containing a number of the selected page, a second word containing the first value of the counter, and a third word containing the initial error control code; and
         writing counter information into frames of the selected page, the frames having a same number of words, wherein writing the counter information into a frame includes writing into the frame a counter identifier that identifies the counter of the plurality of counters and a value independent from the counter identifier; and
      determining a current value of the counter based on the first value of the counter and frames of the selected page into which the counter information is written.

17. The electronic circuit of claim 16, wherein writing the counter information includes updating the current value of the counter by writing the counter information into a new frame of the selected page.

18. The electronic circuit of claim 16, wherein the method includes determining the current value of the counter by incrementing or decrementing the first value of the counter a number of times equal to how many frames in the selected page include the counter identifier of the counter.

19. The electronic circuit of claim 16, wherein writing the counter information into the frame includes writing an increment value or a decrement value into the frame, and the determining the current value of the counter comprises incrementing or decrementing the first value of the counter based on the increment values or the decrement values written into the frames into which the counter information is written.

20. The electronic circuit of claim 16, wherein writing header data into the selected page includes calculating the first value of the counter based on a previous counter value in a previous page.

21. The electronic circuit of claim 16, wherein the method includes controlling access to the flash memory based on the determined current value of the counter.

22. The flash memory control circuit of claim 11 wherein the method includes controlling access to the flash memory based on the determined current value of the counter.

23. The method of claim 1, comprising controlling access to the flash memory based on the determined current value of the counter.

* * * * *